United States Patent [19]
Mensink et al.

[11] Patent Number: 5,828,265
[45] Date of Patent: Oct. 27, 1998

[54] DEGENERATED DIFFERENTIAL PAIR WITH CONTROLLABLE TRANSCONDUCTANCE

[75] Inventors: Clemens H. J. Mensink, Nijmegen; Bram Nauta, Eindhoven, both of Netherlands

[73] Assignee: U.S. Philips Corporation, New York, N.Y.

[21] Appl. No.: 854,003

[22] Filed: May 8, 1997

[30] Foreign Application Priority Data

May 9, 1996 [EP] European Pat. Off. .............. 96201256

[51] Int. Cl.⁶ ..................................................... G06G 7/12
[52] U.S. Cl. .............................. 327/563; 327/63; 330/254
[58] Field of Search .................................... 327/563, 560, 327/63, 65, 77, 427, 434; 330/254, 253

[56] References Cited

U.S. PATENT DOCUMENTS

| | | |
|---|---|---|
| 4,345,214 | 8/1982 | Harford .................................... 330/254 |
| 5,198,780 | 3/1993 | Kase ......................................... 330/253 |
| 5,210,504 | 5/1993 | Yagita et al. ............................. 330/253 |
| 5,371,475 | 12/1994 | Brown ..................................... 330/254 |
| 5,612,648 | 3/1997 | McClellan et al. ...................... 327/563 |

Primary Examiner—Toan Tran
Attorney, Agent, or Firm—Steven R. Biren

[57] ABSTRACT

A differential pair with input transistors and provided with a variable degeneration resistor. The degeneration resistor comprises a series arrangement of two branches of coupled resistors which are shunted in mutually corresponding points by respective control transistors whose gates are interconnected. The differential pair further comprises a control loop comprising two current mirrors a bias resistor and a current source for providing a control signal to the gates of the control transistors. The control loop does not influence the DC bias of the differential pair.

19 Claims, 2 Drawing Sheets

DEGENERATED DIFFERENTIAL PAIR WITH CONTROLLABLE TRANSCONDUCTANCE

BACKGROUND OF THE INVENTION

1. Field of the Invention

The invention relates to a differential pair comprising a first and a second transistor each with a control electrode and a main current path between a first and a second main electrode, and a degeneration resistor for coupling the first main electrode of the first transistor to the first main electrode of the second transistor.

2. Description of Related Art

Such a circuit is known from U.S. Pat. No. 5,210,504. In this known circuit, the differential pair is realized by means of field effect transistors, while the degeneration resistor is connected in series with the sources of the field effect transistors, and a control field effect transistor is connected with its source and drain in parallel to the degeneration resistor so as to control the transconductance of the differential pair. The control field effect transistor acts as a variable degeneration resistor whose value is controlled by means of a control signal at its gate. The non-controllable degeneration resistor serves as an upper limit for the resulting resistance value of the parallel circuit of the non-controllable resistor with the control field effect transistor.

A disadvantage of the known differential pair is that the distortion of the differential pair is great owing to the strongly non-linear resistance characteristic of the control field effect transistor.

SUMMARY OF THE INVENTION

It is an object of the invention to provide a differential pair with a controllable transconductance which has a low distortion.

According to the invention, the differential pair is for this purpose characterized in that the degeneration resistor is built up from a series circuit of a first branch of coupled resistors and a second branch of coupled resistors which are shunted in mutually corresponding junction points by respective control transistors whose control electrodes are connected so as to receive a control signal, the first main electrode of the first transistor being coupled to the first branch and the first main electrode of the second transistor being coupled to the second branch.

The invention is based on the recognition that the degeneration resistor can be built up from branches of fixed resistances connected in series, and that portions of these branches can be short-circuited gradually by means of control field effect transistors. The non-linear series resistance of the control field effect transistors thus contributes only to a low degree to the resulting resistance value of the controllable degeneration resistor, with the advantage that the resistance characteristic of the controllable degeneration resistor is substantially linear.

An embodiment of a differential pair according to the invention may be characterized in that the differential pair in addition comprises a bias resistor which is preferably coupled with a first electrode to a common junction point of the first and second branches, and with a second electrode to the control electrodes of the respective control transistors. A controllable current is passed through the bias resistor. A control voltage is thus obtained at the control electrodes of the control transistors, by means of which the transconductance of the differential pair can be controlled. A coupling of the first electrode of the bias resistor to the common junction point has the advantage that a suitable value of the control voltage applied to the control electrodes of the control transistors is thus generated in a simple manner.

A further embodiment of the differential pair according to the invention may be characterized in that the differential pair in addition comprises a control loop for generating a control current through the bias resistor in response to the control signal. The control loop supplies as much current to the common junction point of the first and second branches as is derived therefrom. An advantage of this is that the DC bias of the differential pair, which is provided by a tail current source coupled to the common junction point, is not disturbed then. The control loop may be constructed with a first current mirror with a first output which is coupled to the second electrode of the bias resistor, a second output, and an input for receiving the control signal; and a second current mirror with an output which is coupled to the first electrode of the bias resistor, and an input which is coupled to the second output of the first current mirror.

An alternative embodiment of the differential pair according to the invention may be characterized in that the first and the second branch constitute the source and drain of an extensive field effect transistor, which field effect transistor is provided with a control electrode which is coupled to the second electrode of the bias resistor. The extensive source, with two connection points at opposed sides, replaces the first branch of resistors. The extensive drain, with two connection points at opposed sides, replaces the second branch of resistors. This embodiment may be used to advantage especially when the control range of the transconductance is wide.

BRIEF DESCRIPTION OF THE DRAWINGS

The invention will be explained in more detail with reference to the accompanying drawing, in which.

The same components or elements have been given the same reference symbols in these FIGS.

DESCRIPTION OF THE PREFERRED EMBODIMENTS

Figure 1:
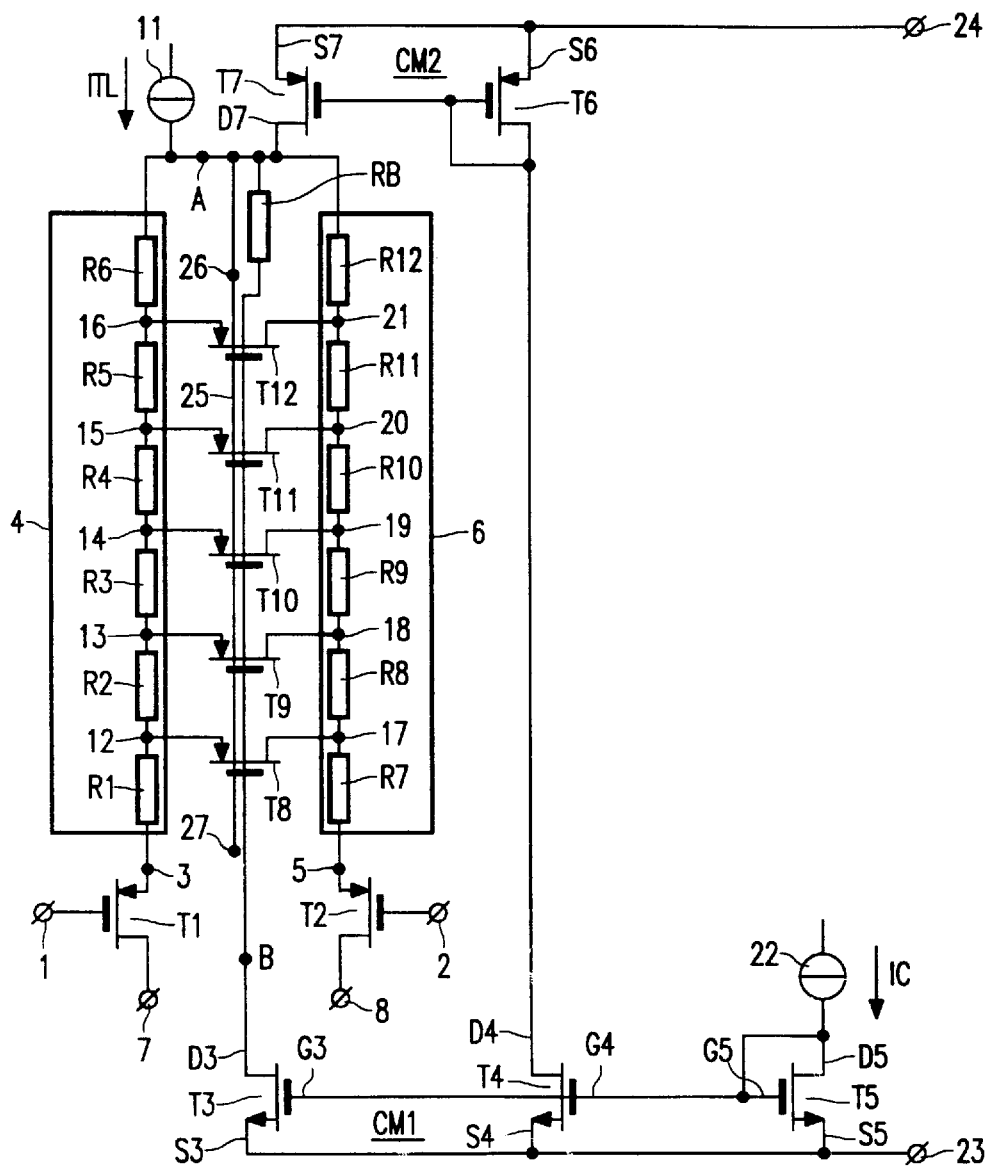
FIG. 1 is a circuit diagram of a first embodiment of a differential pair according to the invention.

The diagram of FIG. 1 represents an embodiment of a differential pair with field effect transistors. The differential pair comprises two input transistors T1 and T2 whose control electrodes, or gates, are connected to an input terminal 1 and an input terminal 2, respectively, for the connection of an input signal. The first main electrodes 3, 5, or sources, of transistors T1 and T2 are connected to a first branch of resistors 4 and a second branch of resistors 6, respectively. The second main electrodes, or drains, of transistors T1 and T2 are connected to a first output terminal 7 and a second output terminal 8, respectively, for delivering an output signal. The branches of resistors 4 and 6 are connected in series in a common junction point A. The branches of resistors 4 and 6 and the transistors T1 and T2 are provided with a DC bias by means of a direct current source 11 which is coupled to the junction point A. The branches of resistors 4 and 6 each comprise a series arrangement of six resistors R1 to R6 and R7 to R12, respectively. Viewed from the sources of the transistors T1 and T2, the mutually corresponding junction points 12/17, 13/18, 14/19, 15/20, and 16/21 of the first and second branches of resistors 4 and 6 are interconnected by means of the respective source-drain paths of control transistors T8 to T12, whose gates are interconnected in a junction point B for receiving a control signal. A bias resistor RB is connected between junction point A and junction point B. The bias resistor RB may be replaced with an alternative element such as, for example, a transistor which is connected as a diode. The differential pair in addition comprises a first current mirror CM1 and a second current mirror CM2. The first current mirror CM1 comprises three transistors T3, T4, and T5. The drain D3 of transistor T3 forms the first output of the first current mirror CM1 and is coupled to the junction point B. The drain D4 of transistor T4 forms the second output of the first current mirror CM1. A transistor T5 connected as a diode forms the input of the first current mirror CM1. A current source 22 is coupled to the input of the first current mirror CM1 for supplying a control current IC. The transistor T6, connected as a diode and coupled to the drain D4, forms the input of the second current mirror CM2. The drain D7 of transistor T7 forms the output of the second current mirror CM2 and is coupled to the junction point A. The sources S3, S4, and S5 are coupled to a negative supply terminal 23 and the sources S6 and S7 are coupled to a positive supply terminal 24.

The operation of the circuit is as follows. A direct current ITL supplied by direct current source 11 flows in equal halves into the two branches of resistors 4 and 6 of the differential pair. The respective potentials at connection points of the branches of the resistors 4 and 6 in FIG. 1 are lowest at source 3 of transistor T1 and source 5 of transistor T2 and subsequently rise to the highest potential at the common junction point A. The transconductance of the differential pair can be varied in that the degeneration resistor built up from the two branches of resistors 4 and 6 is controllable through the gradual switching ON or OFF of one or several control transistors. The control voltage required at the gates of the control transistors T8 to T12 is generated by means of a control current through the bias resistor RB which is proportional to the control current IC. The former control current is generated by a control loop formed by the two current mirrors CM1 and CM2, the bias resistor RB, and the current source 22. The transconductance of the differential pair is controlled in this manner without influencing the DC bias of the differential pair. If the control current IC is equal to zero, the voltage drop across the bias resistor RB is also equal to zero. As a result of this, the potential at the gates of the control transistors T8 to T12 is so high that all control transistors T8 to T12 are not conducting. The resulting value of the degeneration resistor is then a maximum, and accordingly the transconductance of the differential pair will be a minimum. As the control current IC rises gradually, the control transistor T12 will be the first to enter the conductive state. As the control current IC rises still further, the control transistors T11, T10, T9, and T8 will enter the conductive state successively. When all control transistors T8 to T12 are conducting, the resulting resistance value of the degeneration resistor will be a minimum, and accordingly the transconductance of the differential pair a maximum.

It is not necessary to give all gates of the control transistors a same potential, as shown in FIG. 1. Indeed, the distortion of the differential pair can be further reduced when the differential pair is provided with means for generating a voltage difference between the gates of two consecutive control transistors. These means may comprise, for example, an arrangement of resistors connected in series, which in its turn is connected in series between the bias resistor RB and the junction point B, successive connection points of the series-connected resistors being connected to successive gates of the control transistors. A common bulk 25 of the control transistors T8 to T12 is coupled, as shown in FIG. 1, with a first bulk connection point 26 to the junction point A. The bulk connection point 26 may also be coupled to an alternative suitable point such as, for example, the positive supply terminal 24. The distortion of the differential pair can be further reduced when the differential pair is provided with means for generating a current through the bulk 25 so that there will be a potential drop across the bulk 25 owing to the ohmic resistance of the bulk 25. These means may comprise, for example, a connection of the bulk connection point 26 to a suitable junction point such as, for example, the positive supply terminal 24, and a coupling of a direct current source to a second bulk connection point 27. If a coupling between the bulk connection point 26 and the junction point A is opted for, an additional provision may be made which supplies the bulk connection point 26 and the bulk connection point 27 with a current in a manner corresponding to the provision which supplies the bias resistor RB with a current, which provision has the advantage that the DC bias of the differential pair also remains unaffected by the current which flows through the bulk 25.

Figure 2:
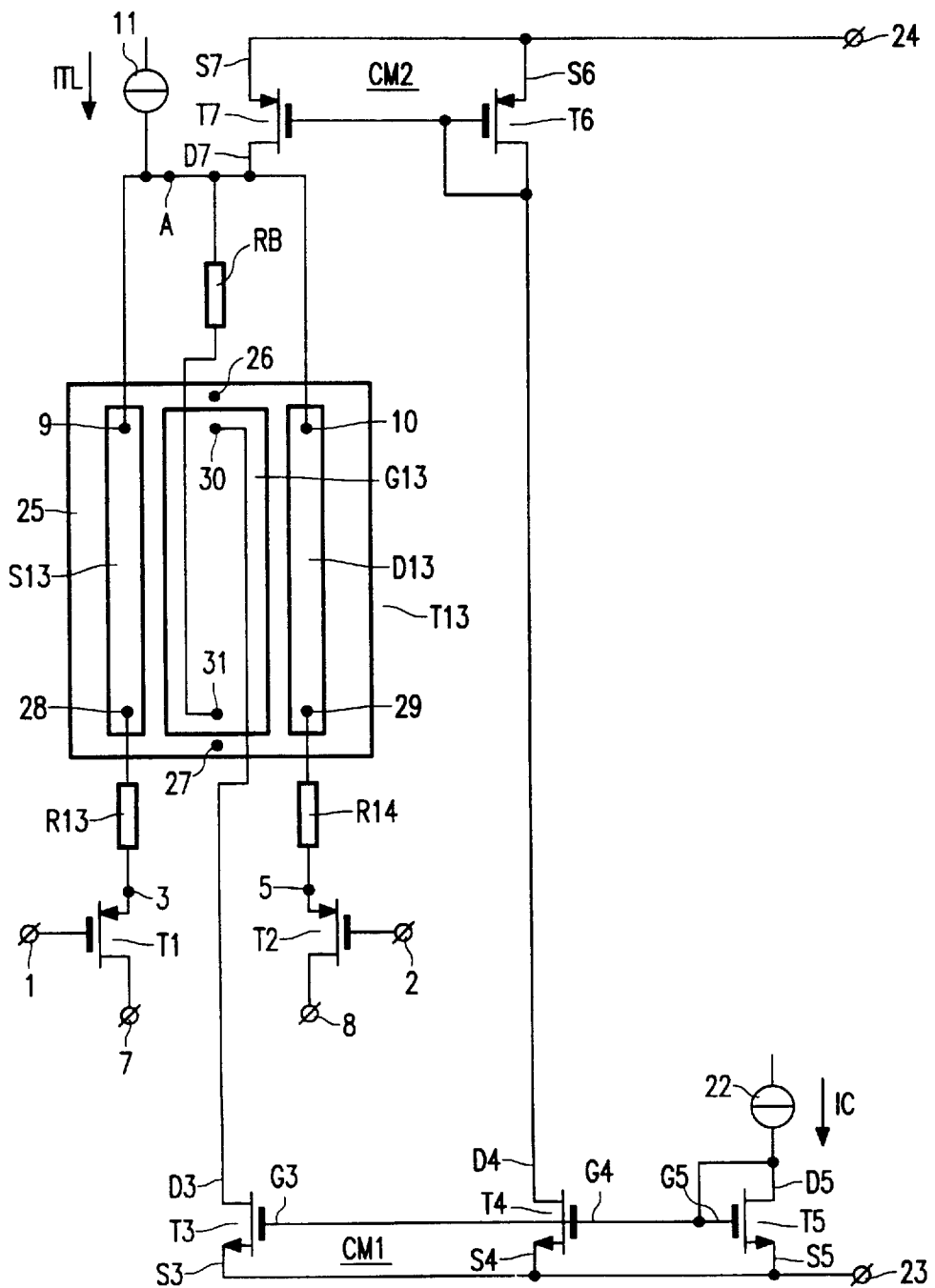
FIG. 2 is a circuit diagram of a second embodiment of a differential pair according to the invention.

The diagram of FIG. 2 shows an alternative embodiment of the differential pair according to the invention. In FIG. 2, an extensive field effect transistor T13 replaces the branches of resistors 4 and 6 and the control transistors T8 to T12 shown in FIG. 1. The field effect transistor T13 comprises an extensive source S13, which replaces the branch of resistors 4, with a first and a second connection point 28 and 9 which are coupled to the source of transistor T1 and to the junction point A, respectively, and an extensive drain D13, which replaces the second branch 6 of resistors, with a first and a second connection point 29 and 10 which are coupled to the source of transistor T2 and to the junction point A, respectively. Between the source S13 and the drain D13 there is an extensive gate G13 with a first and a second gate connection point 30 and 31 which lie at opposite sides of the gate G13, these sides extending parallel to the direction of the main current path of the transistor T13. The transistor T13 further comprises an extensive bulk 25 with bulk connection points 26 and 27 which lie at opposite sides of the bulk 25, these sides extending parallel to the direction of the main current path of the transistor T13. The differential pair further comprises a resistor R13 which is connected in series between the second connection point 28 of the source S13 and the source 3 of transistor T1, and a resistor R14 which is connected in series between the second connection point 29 of the drain D13 and the source 5 of transistor T2. The ohmic resistance of the extensive source S13 and the ohmic resistance of the extensive drain D13 act as branches comprising an infinite number of coupled infinitesimally small resistances. The resulting value of the degeneration resistor is increased with the resistances R13 and R14. The resistances R13 and R14 may be dispensed with, if so desired. In that case, the connection points 28 and 29 must be coupled to the main electrodes 3 and 5 of transistors T1 and T2, respectively. The gate connection points 30 and 31 are coupled to the drain D3 of transistor T3 and to the second electrode of the bias resistor RB, respectively. This construction renders it possible to pass a current through the gate G13. Owing to the ohmic resistance of gate G13, the potential of gate G13 is lowest at the gate connection point 30 in this example and subsequently gradually rises along the gate G13, having a maximum value at the gate connection point 31. The transistor T13 can be brought into conduction in an even more gradual manner through a suitable choice of the current flowing through the gate G13, so that the distortion of the differential pair is even less. It is also possible to omit the second gate connection point 31. In that case the bias resistor RB must be coupled between the junction point A and the junction point 30. The gate G13 obviously does not pass a current then.

The operation of the differential pair shown in FIG. 2 is substantially the same as that of the differential pair of FIG. 1. If the control current IC is equal to zero, the voltage drop across the bias resistor RB is also equal to zero. Consequently, the potentials at gate G13 are so high that the extensive field effect transistor T13 is not conducting. The resulting resistance value of the degeneration resistor is a maximum then, and the transconductance of the differential pair is accordingly a minimum. Now as the control current IC rises gradually, an increasing portion of the extensive field effect transistor T13 will become conducting, until the extensive field effect transistor T13 is conducting in its entirety. The resulting resistance value of the degeneration resistor is a minimum then, and the transconductance of the differential pair accordingly a maximum.

The current mirrors indicated in FIG. 1 and FIG. 2 may be replaced by current mirrors of different types. Instead of field effect transistors of the conductivity type indicated, it is also possible to use field effect transistors of an opposed conductivity type. The polarities of the voltage sources and current sources should then be adapted accordingly. The number of resistors from which the branches of resistors are built up and the number of accompanying control transistors may be greater or smaller than the numbers shown in FIG. 1. Instead of field effect transistors, it is also possible to use bipolar transistors, in which case the base, emitter, and collector take the places of the gate, source, and drain of a field effect transistor. A combination of bipolar transistors and field effect transistors is also possible, for example field effect transistors for transistors T8 to T12 and bipolar transistors for transistors TI to T7. The differential pair may be realized in the form of an integrated circuit as well as by means of discrete components.

We claim:

1. A differential pair comprising a first (T1) and a second transistor (T2) each with a control electrode and a main current path between a first (3, 5) and a second (7, 8) main electrode, and a degeneration resistor for coupling the first main electrode (3) of the first transistor (T1) to the first main electrode (5) of the second transistor (T2), characterized in that the degeneration resistor is built up from a series circuit of a first branch (4) of coupled resistors (R1–R6) and a second branch (6) of coupled resistors (R7–R12) which are shunted in mutually corresponding junction points (12/17, 13/18, 14/19, 15/20, 16/21) by respective control transistors (T8–T12) whose control electrodes are connected so as to receive a control signal, the first main electrode (3) of the first transistor (T1) being coupled to the first branch (4) and the first main electrode (5) of the second transistor (T2) being coupled to the second branch (6).

2. A differential pair as claimed in claim 1, characterized in that the differential pair in addition comprises a bias resistor (RB) which is coupled with a first electrode to a common junction point (A) of the first (4) and the second branch (6), and which is coupled with a second electrode to the control electrodes of the respective control transistors (T8–T12).

3. A differential pair as claimed in claim 2, characterized in that the differential pair in addition comprises a control loop for generating a control current through the bias resistor (RB) in response to the control signal.

4. A differential pair as claimed in claim 3, characterized in that the control loop comprises a first current mirror (CM1) with a first output (D3) which is coupled to the second electrode of the bias resistor (RB), a second output (D4), and an input (D5, G5) for receiving the control signal, and a second current mirror (CM2) with an input (D7) which is coupled to the first electrode of the bias resistor (RB), and with an input which is coupled to the second output (D4) of the first current mirror (CM1).

5. A differential pair as claimed in claim 1, characterized in that the differential pair comprises means for generating a voltage difference between the control electrodes of two consecutive control transistors.

6. A differential pair as claimed in claim 2, characterized in that the bias resistor (RB) comprises a transistor connected as a diode.

7. A differential pair as claimed in claim 2, characterized in that the first (4) and the second branch (6) constitute the source (S13) and drain (D13) of an extensive field effect transistor (T13), which field effect transistor (T13) is provided with a control electrode (G13) which is coupled to the second electrode of the bias resistor (RB).

8. A differential pair as claimed in claim 1, characterized in that the first (4) and the second branch (6) constitute the source (S13) and drain (P13) of an extensive field effect transistor (T13).

9. A differential pair as claimed in claim 7, characterized in that a resistor (R13) is connected in series with the first main electrode (3) of the first transistor (T1) and in that a resistor (R14) is connected in series with the first main electrode (5) of the second transistor (T2).

10. A differential pair as claimed in claim 4, characterized in that the control electrode (G13) of the field effect transistor (T13) is provided with a first connection point (30) which is coupled to the first output (D3) of the first current mirror (CM1), and with a second connection point (31) which is coupled to the second electrode of the bias resistor (RB).

11. A differential pair as claimed in claim 2, characterized in that the differential pair comprises means for generating a voltage difference between the control electrodes of two consecutive control transistors.

12. A differential pair as claimed in claim 3, characterized in that the differential pair comprises means for generating a voltage difference between the control electrodes of two consecutive control transistors.

13. A differential pair as claimed in claim 4, characterized in that the differential pair comprises means for generating a voltage difference between the control electrodes of two consecutive control transistors.

14. A differential pair as claimed in claim 5, characterized in that the bias resistor (RB) comprises a transistor connected as a diode.

15. A differential pair as claimed in claim 12, characterized in that the bias resistor (RB) comprises a transistor connected as a diode.

16. A differential pair as claimed in claim 3, characterized in that the first (4) and the second branch (6) constitute the source (S13) and drain (D13) of an extensive field effect transistor (T13), which field effect transistor (T13) is provided with a control electrode (G13) which is coupled to the second electrode of the bias resistor (RB).

17. A differential pair as claimed in claim 4, characterized in that the first (4) and the second branch (6) constitute the source (S13) and drain (D13) of an extensive field effect transistor (T13), which field effect transistor (T13) is provided with a control electrode (G13) which is coupled to the second electrode of the bias resistor (RB).

18. A differential pair as claimed in claim 5, characterized in that the first (4) and the second branch (6) constitute the source (S13) and drain (D13) of an extensive field effect transistor (T13), which field effect transistor (T13) is provided with a control electrode (G13) which is coupled to the second electrode of the bias resistor (RB).

19. A differential pair as claimed in claim 8, characterized in that a resistor (R13) is connected in series with the first main electrode (3) of the first transistor (T1) and in that a resistor (R14) is connected in series with the first main electrode (5) of the second transistor (T2).

* * * * *